United States Patent [19]

Numata et al.

[11] 4,020,363

[45] Apr. 26, 1977

[54] INTEGRATION CIRCUIT WITH A POSITIVE FEEDBACK RESISTOR

[75] Inventors: Saburo Numata; Shinichiro Fujino, both of Urawa, Japan

[73] Assignee: Fuji Photo Optical Co., Ltd., Omiya, Japan

[22] Filed: Dec. 23, 1975

[21] Appl. No.: 643,814

[30] Foreign Application Priority Data

Dec. 25, 1974 Japan ................................ 49-186

[52] U.S. Cl. ............................... 307/229; 235/183; 328/127

[51] Int. Cl.² ..................... G06G 7/12; H03K 5/00; G06G 7/18

[58] Field of Search ...................... 235/150.51, 183; 307/229; 328/127-128

[56] References Cited

UNITED STATES PATENTS

| | | | |
|---|---|---|---|
| 3,142,803 | 7/1964 | Bigelow | 328/127 |
| 3,541,320 | 11/1970 | Beall | 328/127 |
| 3,543,049 | 11/1970 | Farnsworth | 307/229 |
| 3,586,874 | 6/1971 | Ferro | 307/229 |
| 3,667,055 | 5/1972 | Uchido | 328/127 |
| 3,906,381 | 9/1975 | Bennett | 328/128 |
| 3,942,036 | 3/1976 | Burckhardt et al. | 307/229 |

*Primary Examiner*—Stanley D. Miller, Jr.

[57] ABSTRACT

In an integration circuit including an operational amplifier wherein an integrating capacitor and a switch are connected in series across the operational amplifier as a negative feedback circuit, a positive feedback resistor is connected between the connecting point between the integrating capacitor and the switch and the reference input terminal of the operational amplifier. The potential difference across the integrating capacitor is made zero in order to remove the influence of the leakage current of the switch when the switch is in its OFF-state.

5 Claims, 2 Drawing Figures

INTEGRATION CIRCUIT WITH A POSITIVE FEEDBACK RESISTOR

BACKGROUND OF THE INVENTION

1. Field of the Invention

This invention relates to an integration circuit for an electric shutter means provided in a photographic camera, and more particularly to a positive feedback circuit for an integration circuit in an electric shutter means built in a photographic camera.

2. Description of the Prior Art

In the conventional electric shutter means for cameras, it has been known to use mechanical switches to make a single operational amplifier have additional functions beside the function of integration. Mechanical switches are, however, disadvantageous in that they cause malfunction of the circuit owing to their chattering and slow response. Therefore, recently semiconductor switches have been substituted for the mechanical switches. The semiconductor switches, however, are not desirable as the switches for an integration circuit operated by small current as employed in an electric shutter means of a photographic camera, since the OFF-resistance of the semiconductor switches is comparatively small. Because of the low OFF-resistance of the semiconductor switches, an integrating capacitor is likely to be undesirably charged by leakage current of the semiconductor switching circuit when the switching circuit is in its OFF state.

SUMMARY OF THE INVENTION

In view of the above-mentioned defect inherent in the conventional electric shutter means, the primary object of the present invention is to provide an integration circuit for an electric shutter in which the undesirable charging of the integrating capacitor is prevented even if semiconductor switches are employed.

Another object of the present invention is to provide an integration circuit for an electric shutter in which the undesirable charging of the integrating capacitor is prevented even when mechanical switches which have a little leakage current in the OFF state are employed.

Still another object of the present invention is to provide an integration circuit for an electric shutter in which the response time is shortened.

A further object of the present invention is to provide an integration circuit for an electric shutter in which the number of switches is reduced and the whole structure of the circuitry is simplified.

A still further object of the present invention is to provide an integration circuit for an electric shutter in which the malfunction of the integration circuit is prevented.

Above and other objects which will be made apparent from the following detailed description of the present invention are accomplished by the provision of a positive feedback circuit in the integration circuit which serves to make the potential difference across the integrating capacitor of the integration circuit substantially zero.

BRIEF DESCIPTION OF THE DRAWING

FIG. 1 is a circuit view showing an embodiment of the integration circuit in accordance with the present invention, and FIG. 2 is a circuit view showing another embodiment of the integration circuit in accordance with the present invention.

DESCRIPTION OF THE PREFERRED EMBODIMENTS

Figure 1:
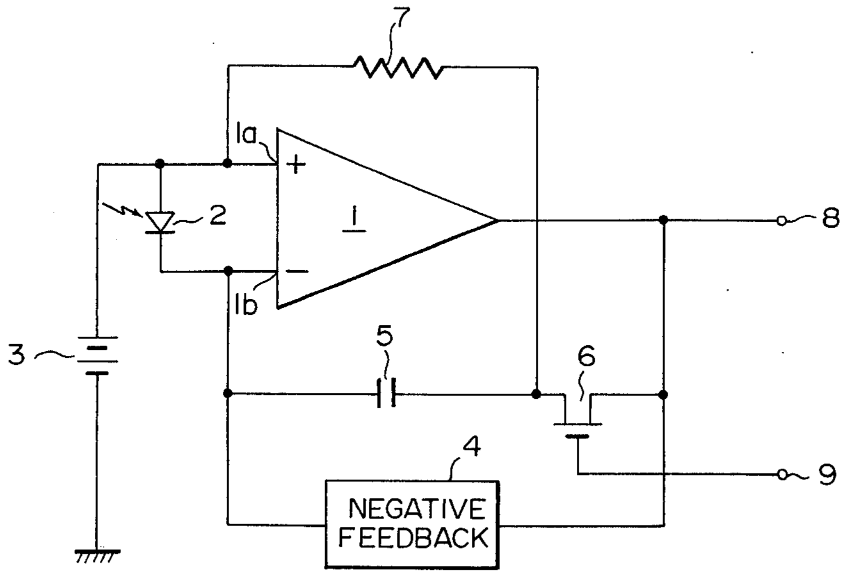

An embodiment of the present invention is illustrated in FIG. 1. A positive input terminal 1a (hereinafter referred to as "reference input terminal") of an operational amplifier 1 is connected with an end of a current limiting means 2 which limits the amount of flow of current therethrough according to the amount of light received thereby such as a photovoltaic type photoreceptor. A silicon blue cell (SBC) or a photo-diode can be used as the current limiting means 2. The reference input terminal 1*a* of the operational amplifier 1 is further connected with a reference voltage source 3 and an end of a positive feedback resistor 7. A negative input terminal 1*b* is connected with the other end of said current limiting means 2 and an end of an integrating capacitor 5. The negative input terminal 1*b* is further connected with an end of a negative feedback element 4 such as a log conversion diode. The other end of the negative feedback element 4 is connected with the output terminal 8 of the operational amplifier 1. The other end of the integrating capacitor 5 is connected with the other end of said positive feedback resistor 7 and the source of a MOS FET (field effect transistor) 6 serving as a semiconductor switching element. The resistance of the positive feedback resistor 7 is much higher than that of the MOS FET 6 when the latter is in ON-state and much lower than that of the MOS FET 6 when it is in OFF-state. The drain of the MOS FET 6 is connected with the output terminal 8 of the operational amplifier 1, so that the MOS FET will conduct a switching operation in accordance with the voltage applied to the gate 9 thereof.

In operation of the integration circuit constructed as described above, the resistance of the MOS FET 6 when it is in the ON-state is much lower than that of the positive feedback resistor 7. Therefore, when the MOS FET 6 is turned ON, i.e. closed, the voltage drop of the integration current caused by the ON-resistance of the MOS FET 6 can be neglected. Thus, the integration circuit as shown in FIG. 1 normally operates as an integration circuit. When the MOS FET 6 is turned OFF, the resistance of the MOS FET 6 becomes much higher than that of the positive feedback resistor 7. Therefore, when the MOS FET 6 is turned OFF, i.e. opened, the potential at the connecting point between the integrating capacitor 5 and the MOS FET 6 becomes substantially equal to the potential at the reference input terminal 1*a* of the operational amplifier 1. Since the potential difference between the positive and negative input terminals 1*a* and 1*b* is substantially zero at this time, the potential difference across the integration capacitor 5 becomes substantially zero and accordingly the capacitor 5 can be regarded as a short-circuit means. Therefore, the integration capacitor 5 is not supplied with any charging voltage. Accordingly, there is no fear of charging of the integrating capacitor 5 when the MOS FET 6 is in its OFF-state.

Figure 2:
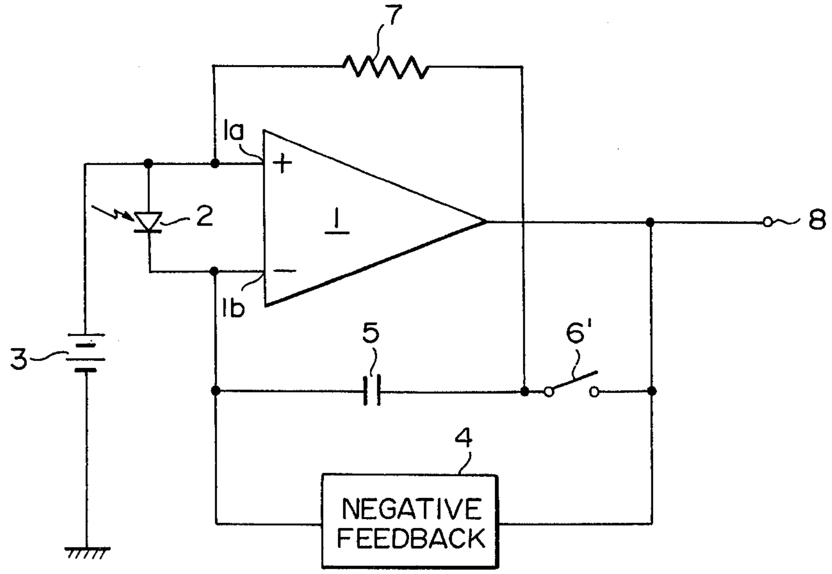

FIG. 2 shows another embodiment of the present invention in which a mechanical switch 6' is employed instead of the MOS FET 6 employed in the first embodiment shown in FIG. 1. Some mechanical switches which are not of high quality usually have a little conductivity when the switch is opened. Therefore, when such a mechanical switch is employed, there is a possibility that the integrating capacitor 5 be undesirably charged by the leakage current of the switch. Therefore, the integration circuit in accordance with the present invention which employs .the positive feedback resistor 7 is also useful in preventing the undesirable charging of the capacitor 5 in this case. Those elements employed in the second embodiment that are equivalent to those employed in the first embodiment shown in FIG. 1 are designated with the same reference numerals.

We claim:

1. An integration circuit comprising an operational amplifier, a negative feedback circuit composed of an integrating capacitor and a switch means connected in series therewith, said negative circuit being connected between the output terminal and the negative input terminal of the operational amplifier, a negative feedback element connected in parallel with said negative feedback circuit, and a current limiting means connected between the positive input terminal and the negative input terminal, wherein the improvement comprising a positive feedback resistor connected between the positive input terminal and a connecting point between said integrating capacitor and said switch means, the resistance of said feedback resistor being higher than the resistance of said switch means when the switch means is in its ON-state and lower than the resistance of said switch means when the switch means is in its OFF-state, whereby the potential difference across said integrating capacitor is made substantially zero.

2. An integration circuit as defined in claim 1 wherein said switch means is a semiconductor switching element.

3. An integration circuit as defined in claim 2 wherein said switch means is a MOS FET.

4. An integration circuit as defined in claim 2 wherein said switch means is a field effect transistor.

5. An integration circuit as defined in claim 1 wherein said switch means is a mechanical switch which has a little conductivity to cause leakage of current when it is closed.

* * * * *

UNITED STATES PATENT AND TRADEMARK OFFICE

CERTIFICATE OF CORRECTION

PATENT NO. : 4,020,363

DATED : April 26, 1977

INVENTOR(S) : Saburo Numata and Shinichiro Fujino

It is certified that error appears in the above-identified patent and that said Letters Patent are hereby corrected as shown below:

Column 3, line 16, "feedback" should be inserted after --negative--.

Signed and Sealed this

*Fifteenth* Day of *November 1977*

[SEAL]

*Attest:*

RUTH C. MASON
*Attesting Officer*

LUTRELLE F. PARKER
*Acting Commissioner of Patents and Trademarks*